United States Patent
Choi

(10) Patent No.: US 7,985,608 B2
(45) Date of Patent: Jul. 26, 2011

(54) METHODS OF MANUFACTURING ACTIVE MATRIX SUBSTRATE AND ORGANIC LIGHT EMITTING DISPLAY DEVICE

(75) Inventor: Woong-Sik Choi, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/695,048

(22) Filed: Jan. 27, 2010

(65) Prior Publication Data

US 2010/0255618 A1 Oct. 7, 2010

(30) Foreign Application Priority Data

Apr. 6, 2009 (KR) .................. 10-2009-0029482

(51) Int. Cl.
*H01L 21/00* (2006.01)
*H01L 21/84* (2006.01)

(52) U.S. Cl. ............... 438/29; 438/22; 438/23; 438/82; 438/99; 438/149; 257/E21.32; 257/E21.372; 257/E27.112; 257/E51.005

(58) Field of Classification Search .................. 438/22, 438/23, 29, 82, 99, 149; 257/E21.32, E21.372, 257/E27.112, E51.005
See application file for complete search history.

(56) References Cited

U.S. PATENT DOCUMENTS

| | | | |
|---|---|---|---|
| 2001/0005598 A1* | 6/2001 | Powell | 438/30 |
| 2004/0229444 A1 | 11/2004 | Couillard et al. | |
| 2005/0255670 A1* | 11/2005 | Couillard et al. | 438/455 |
| 2005/0266658 A1* | 12/2005 | Couillard et al. | 438/455 |
| 2005/0285108 A1* | 12/2005 | Choi | 257/59 |
| 2006/0234477 A1* | 10/2006 | Gadkaree | 438/478 |
| 2007/0048968 A1* | 3/2007 | Couillard et al. | 438/455 |
| 2007/0117354 A1* | 5/2007 | Gadkaree et al. | 438/478 |
| 2007/0141802 A1* | 6/2007 | Gadkaree | 438/455 |
| 2007/0249139 A1* | 10/2007 | Gadkaree et al. | 438/458 |
| 2007/0277874 A1* | 12/2007 | Dawson-Elli et al. | 136/256 |
| 2009/0189148 A1* | 7/2009 | Araumi et al. | 257/40 |
| 2009/0294853 A1* | 12/2009 | Fenger et al. | 257/347 |

* cited by examiner

*Primary Examiner* — Alexander G Ghyka
*Assistant Examiner* — Leonard Chang
(74) *Attorney, Agent, or Firm* — Christie, Parker & Hale, LLP

(57) ABSTRACT

A method of manufacturing an active matrix substrate that enables increased productivity due to a reduction in the number of patterning processes and low generation of particles during the patterning processes. The method includes forming a patterned electrode on a substrate, and covering the first electrode with an insulating film. A mono-crystalline semiconductor layer is then formed on the insulating film by attaching a first layer formed on a surface of a semiconductor wafer to the insulating film, and peeling off a portion of the semiconductor wafer. The semiconductor layer is then patterned and doped, in part, by utilizing the patterned electrode as a photo mask for light illuminated from a lower side of the substrate. This results in part in mono-crystalline active layers for thin film transistors, which are then configured to form a pixel for an active matrix substrate.

16 Claims, 5 Drawing Sheets

METHODS OF MANUFACTURING ACTIVE MATRIX SUBSTRATE AND ORGANIC LIGHT EMITTING DISPLAY DEVICE

CROSS-REFERENCE TO RELATED PATENT APPLICATION

This application claims priority to and the benefit of Korean Patent Application No. 10-2009-0029482, filed on Apr. 6, 2009, in the Korean Intellectual Property Office, the entire content of which is incorporated herein by reference.

BACKGROUND OF THE INVENTION

1. Field of the Invention

The following description relates to methods of manufacturing an active matrix substrate and an organic light emitting display device.

2. Description of the Related Art

Recent flat panel display devices are driven using an active matrix method, where a light emitting device is formed on an active matrix substrate that includes a plurality of thin film transistors.

With regard to recent flat panel display devices, a light emitting device is formed with an active matrix substrate that includes a thin film transistor and is driven using an active matrix method. In particular, an organic light emitting display device includes a thin film transistor formed with a poly silicon material. When a low temperature crystallization method is used for forming the poly silicon material, the process of manufacturing the flat panel display devices is very complicated, and thus productivity is reduced.

That is, in order to form the active matrix substrate, a large number of patterning processes are required. Also, a photolithography process is employed, wherein photo masks corresponding to desired patterns are used in each of the patterning processes.

Furthermore, in order to realize a complementary metal-oxide semiconductor (CMOS), at least two more photo processes are required before performing the process for doping a semiconductor active layer, and thus, at least two more photo masks must be provided for the photo processes.

Accordingly, manufacturing costs are increased due to the many pieces of equipment used for performing the photo processes, and an overall process time is increased due to the photo processes, thereby reducing productivity.

Also, low productivity is caused by particles generated during various processes.

SUMMARY OF THE INVENTION

Aspects of embodiments of the invention are directed toward a method of manufacturing an active matrix substrate that enables increased productivity due to a reduction in the number of masks and patterning processes, a low generation of particles during the patterning processes, and a reduced failure rate; and a method of manufacturing an organic light emitting display device.

According to an embodiment of the present invention, a method of manufacturing an active matrix substrate includes forming a first electrode in a first pattern on a substrate; forming a first insulating film to cover the first electrode on the substrate; attaching a first layer on a surface of a semiconductor wafer to the first insulating film; transferring the first layer onto the first insulating film to form a semiconductor layer on the first insulating film; patterning the semiconductor layer to form a first active layer having a first region and a second active layer having a second region, wherein the first region and the second region are doped with different types of dopants from each other; forming a second insulating film to cover the first and second active layers on the first insulating film; and forming a second electrode to couple the first region to the second region.

In some embodiments, the patterning of the semiconductor layer to form the first and second active layers includes forming a first resist layer on the semiconductor layer to cover a first portion of the semiconductor layer and to expose the first region of the semiconductor layer through an opening in the first resist layer; doping the first region of the semiconductor layer with dopant through the opening of the first resist layer; removing the first resist layer; forming a second resist layer on the semiconductor layer to cover a second portion of the semiconductor layer and to expose the second region of the semiconductor layer; removing the second resist layer; and patterning the semiconductor layer into a second pattern to form the first active layer having the first region and the second active layer having the second region.

The forming of the first layer on the surface of the semiconductor wafer may include ion implanting a gas that includes hydrogen ions into a surface of the semiconductor wafer.

The semiconductor wafer may be formed of mono-crystalline silicon.

A pattern of the opening in the first resist layer may be substantially the same as a pattern in which portions other than portions of the first resist layer corresponding to the first pattern of the first electrode are etched.

In some embodiments, the forming of the first resist layer includes exposing the first resist layer to light from a lower side of the substrate in accordance with the first pattern of the first electrode; and etching the first resist layer so as to maintain portions of the first resist layer to substantially correspond in position to the first pattern of the first electrode.

The patterning of the semiconductor layer into the second pattern may be performed prior to the forming of the first resist layer.

According to another aspect of an exemplary embodiment of the present invention, a method of manufacturing an organic light emitting display device includes forming a first gate electrode, a second gate electrode, and a third gate electrode on a substrate; forming a first insulating film to cover the first gate electrode on the substrate; attaching a first layer on a surface of a semiconductor wafer to the first insulating film; transferring the first layer onto the first insulating film to form a semiconductor layer on the first insulating film; patterning the semiconductor layer to form a first active layer having a first region, a second active layer having a second region, and a third active layer having a third region, wherein at least the first region and the second region are doped with different types of dopants from each other; forming a second insulating film to cover the first through third active layers on the first insulating film; forming a second electrode to couple the first region to the second region and forming a pixel electrode coupled to the third region on the second insulating film; forming a third insulating film to cover the second electrode and the pixel electrode on the second insulating film; forming an opening in the third insulating film to expose at least one portion of the pixel electrode; forming an organic film that includes a light emitting layer on the at least one portion of the pixel electrode exposed through the opening in the third insulating film; and forming a facing electrode to cover the organic film.

The forming of the first through third active layers may include forming a first resist layer on the semiconductor layer to cover the semiconductor layer and having an opening to expose the first region of the semiconductor layer; doping the first region of the semiconductor layer with a dopant through the opening of the first resist layer; removing the first resist layer; forming a second resist layer on the semiconductor layer to cover the semiconductor layer and having an opening to expose the second and third regions of the semiconductor layer; doping the second and third regions of the semiconductor layer with dopant through the opening of the second resist layer; and removing the second resist layer.

The forming of the first layer on the surface of the semiconductor wafer may include ion implanting a gas that includes hydrogen ions into a surface of the semiconductor wafer.

The semiconductor wafer may be formed of mono-crystalline silicon.

A pattern of the opening in the first resist layer may be substantially the same as a pattern in which portions other than the portions of the first resist layer corresponding to the first through third gate electrodes are etched.

The forming of the first resist layer may include exposing the first resist layer to light from a lower side of the substrate in accordance with a pattern of the first through third gate electrodes; and etching the first resist layer so as to maintain portions of the first resist layer substantially corresponding to the pattern of the first through third gate electrodes.

The patterning of the semiconductor layer may be performed prior to the forming the first resist layer.

According to aspects of various exemplary embodiments of the present invention, in manufacturing an organic light emitting display device, an active matrix substrate, which is a base substrate, is simply patterned using a small number of photo masks, thereby reducing manufacturing costs and increasing yield.

Also, a further improved circuit can be realized since the semiconductor layer of the thin film transistor can be formed of a mono-crystalline semiconductor material.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF EXEMPLARY EMBODIMENTS

Figure 1:
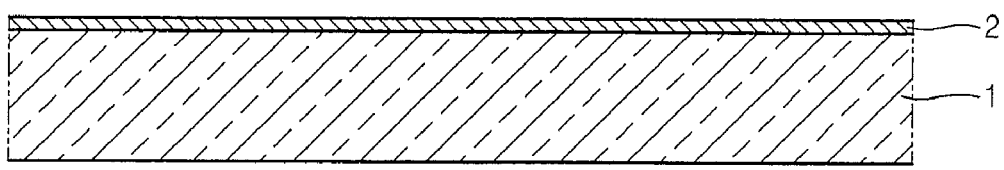
FIG. 1 is a schematic cross-sectional view of a first conductive film formed on a substrate according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

FIGS. 1 through 12 are schematic cross-sectional views that sequentially show methods of manufacturing an active matrix substrate and an organic light emitting display device according to an embodiment of the present invention.

Referring to FIG. 1, a first conductive film 2 is formed on a substrate 1. The substrate 1 is formed of a transparent glass material that includes alkali earth ions. A buffer layer mainly formed of $SiO_2$ may further be formed on the substrate 1.

The first conductive film 2 may be formed of a highly conductive metal used to form an electrode, for example, an alloy that includes Al, Ti, Mo, Ag, and/or Cr.

Figure 2:
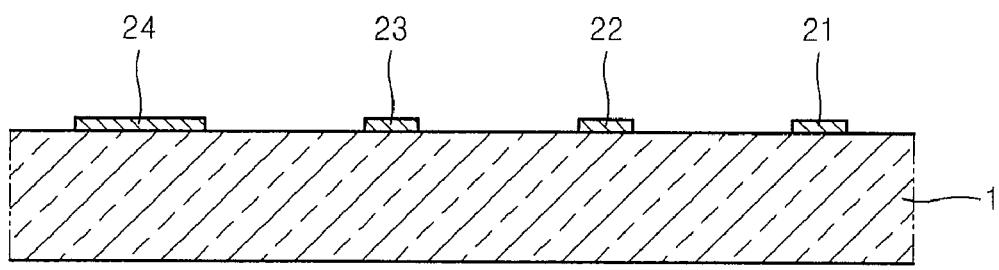
FIG. 2 is a schematic cross-sectional view of the first conductive film of FIG. 1 patterned to a first pattern.

The first conductive film 2 is patterned into a first pattern as shown in FIG. 2 via a photo process using a first photo mask. The photo process may be a conventional photolithography process. That is, after forming a first photo resist film on the first conductive film 2, the first resist film is exposed through the first photo mask and the first conductive film 2 is patterned into the first pattern as shown in FIG. 2 through a development process and an etching process, and then, the first photo resist film remaining on the first conductive film 2 is removed.

The first pattern includes various signal electrodes such as a first gate electrode 21, a second gate electrode 22, a third gate electrode 23, and a capacitor lower electrode 24.

Figure 3:
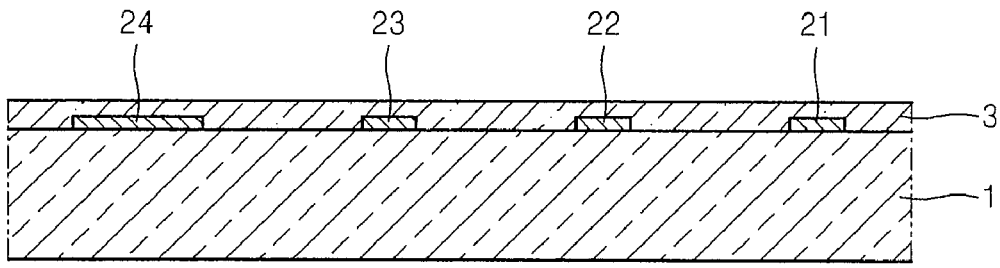
FIG. 3 is a schematic cross-sectional view of a first insulating film formed on the substrate of FIG. 2.

Next, referring to FIG. 3, a first insulating film 3 covering the first gate electrode 21, the second gate electrode 22, the third gate electrode 23, and the capacitor lower electrode 24 is formed on the substrate 1. The first insulating film 3 may be an optically transparent insulating film, and may be formed of an oxide material that includes alkali ions and/or alkali earth ions, for example, a silica group.

A semiconductor film is formed on the first insulating film 3.

According to an embodiment of the present invention, the semiconductor film is formed using a semiconductor layer transfer printing method disclosed in U.S. Patent Publication No. US2004/0229444, the entire content of which is incorporated herein by reference.

Figure 4:
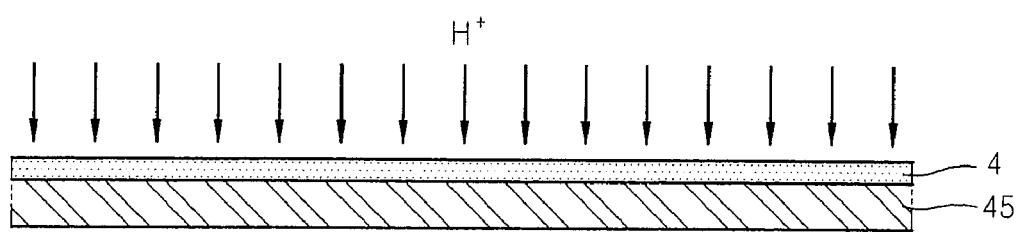
FIG. 4 is a schematic cross-sectional view showing ion implanting in a semiconductor wafer.

That is, referring to FIG. 4, after preparing a semiconductor wafer 45, a surface of the semiconductor wafer 45 is ion implanted. The semiconductor wafer 45 may be, but the present invention is not limited thereto, a mono-crystalline silicon wafer, a mono-crystalline wafer formed of a semiconductor material such as SiGe, SiC, Ge, GaAs, GaP, InP, or the like.

The ion implanting may be performed using, but the present invention is not limited thereto, hydrogen ions, a mixture of boron ions and hydrogen ions, or a mixture of helium ions and hydrogen ions.

As a result of the ion implanting, a semiconductor layer 4, which is a weak region, is formed on a surface of the semiconductor wafer 45.

The semiconductor layer 4 formed in this way is oxidized after a washing process. The oxidization treatment may be an oxygen plasma treatment, a hydrogen peroxide treatment, a hydrogen peroxide and ammonia treatment, and/or a hydrogen peroxide and acid treatment. As a result of the oxidization treatment, hydroxyl groups are formed on the surface of the semiconductor layer 4 and the surface becomes hydrophilic.

Figure 5:
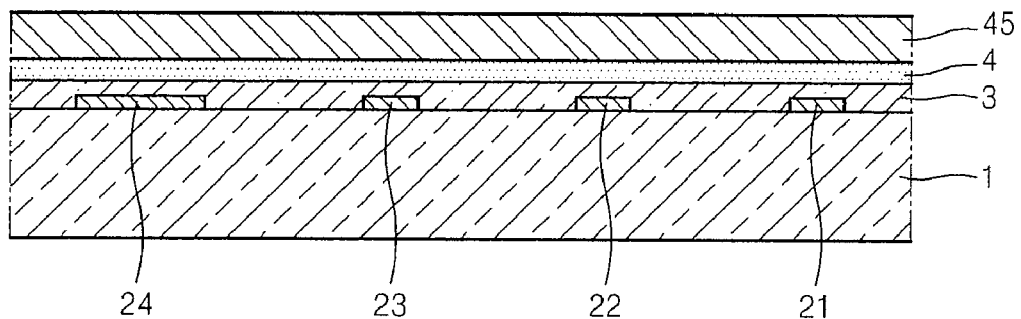
FIG. 5 is a c schematic cross-sectional view showing a joining state of the semiconductor wafer of FIG. 4 with the first insulating film of FIG. 3.

Next, referring to FIG. 5, the semiconductor wafer 45 is placed on the first insulating film 3 so that the semiconductor layer 4 contacts the first insulating film 3 and is between the semiconductor wafer 45 and the insulating film 3. Here, according to one embodiment, the surface of the first insulating film 3 is washed and planarized before the semiconductor wafer 45 is placed on the first insulating film 3.

Next, the semiconductor layer 4 and the first insulating film 3 are joined to each other using an electrolysis method as described below in more detail.

First, both the semiconductor layer 4 and the first insulating film 3 are heated at different temperatures from each other. The temperature difference is maintained to match the thermal expansion coefficients of the semiconductor layer 4 and the first insulating film 3, and thus, to peel off the semiconductor layer 4 from the semiconductor wafer 45 in a subsequent process due to thermal stress. In some embodiments, the temperature difference is between 100 to 150° C. (or between about 100 and 150° C.).

Next, the semiconductor layer 4 and the first insulating film 3 are respectively maintained at uniform temperatures while compressing the semiconductor layer 4 against the first insulating film 3. Afterwards, a voltage is applied to the semiconductor layer 4 and the first insulating film 3, for example, using the semiconductor layer 4 as an anode and the first insulating film 3 as a cathode.

Due to the application of the voltage, alkali ions and/or alkali earth ions present at an interface between the first insulating film 3 and the semiconductor layer 4 are moved to the first insulating film 3. As a result, an alkali ion-free region or an alkali earth ion-free region is formed at the interface between the first insulating film 3 and the semiconductor layer 4, and thus, the first insulating film 3 and the semiconductor layer 4 are further strongly joined.

The processes of compressing the semiconductor layer 4 against the first insulating film 3 and applying the voltage are performed for a period of time (e.g., a predetermined period of time), and then the assembled body is cooled at room temperature. Then, the semiconductor wafer 45 separates from the semiconductor layer 4 due to thermal stress between the semiconductor layer 4 and the semiconductor wafer 45.

Figure 6:
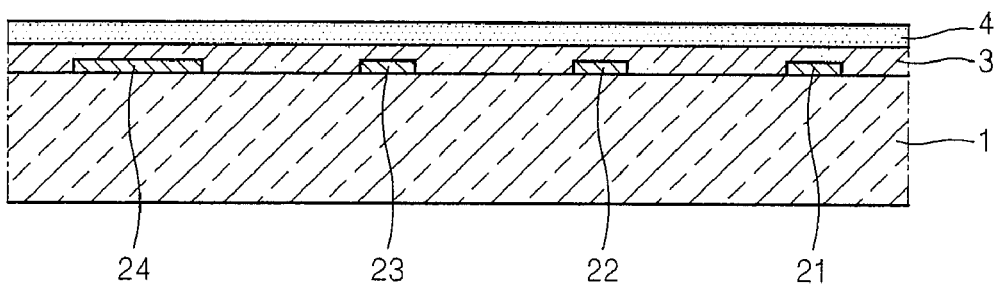
FIG. 6 is a schematic cross-sectional view of a semiconductor layer formed on the first insulating film by peeling the semiconductor wafer of FIG. 5.

Referring to FIG. 6, the semiconductor wafer 45 separates from the semiconductor layer 4 using a peeling process. Here, the semiconductor layer 4 remains attached to the first insulating film 3.

After the semiconductor layer 4 is formed as described above, the semiconductor layer 4 undergoes a surface washing process and an etching process so that the thickness thereof becomes substantially uniform.

Figure 7:
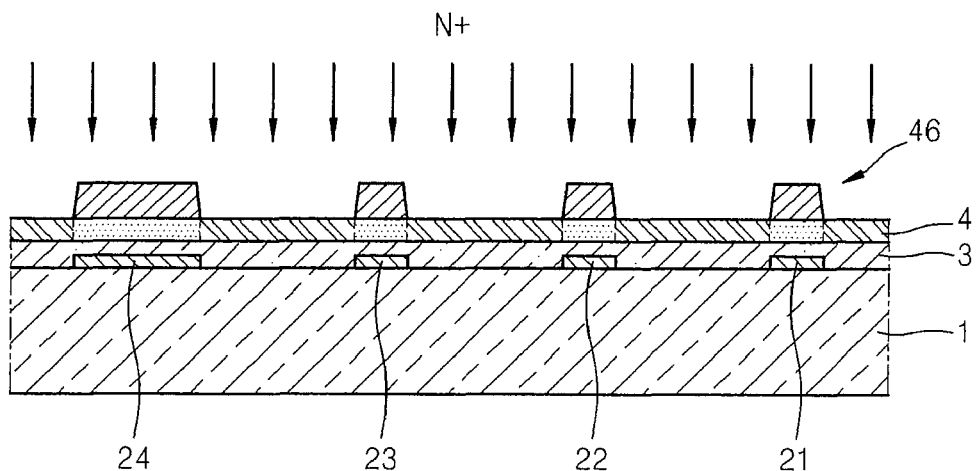
FIG. 7 is a schematic cross-sectional view showing doping of the semiconductor layer after forming a second resist film on the semiconductor layer.

Referring to FIG. 7, after coating a second resist film 46 on the semiconductor layer 4, the second resist film 46 is patterned into a second pattern.

Here, the patterning of the second resist film 46 into the second pattern is performed using not an additional photo mask but the first pattern, that is, the pattern of the first gate electrode 21, the second gate electrode 22, the third gate electrode 23, and the capacitor lower electrode 24 by irradiating light toward the second resist film 46 from a lower side of the substrate 1. That is, when light is irradiated from the lower side of the substrate 1, regions of the second resist film 46 through which the light substantially cannot pass because of the first conductive film 2 of the first pattern, that is, the first gate electrode 21, the second gate electrode 22, the third gate electrode 23, and the capacitor lower electrode 24, have a different degree of hardening from regions of the second resist film 46 through which the light passes, and thus, the second pattern as shown in FIG. 7 is obtained when the second resist film 46 is etched. In the second pattern of FIG. 7, the second resist film 46 remains on the semiconductor layer 4 in regions corresponding to upper parts of the first conductive film 2 of the first pattern, that is, the first gate electrode 21, the second gate electrode 22, the third gate electrode 23, and the capacitor lower electrode 24, and the other regions of the semiconductor layer 4 are exposed.

In this state, N+ ions are doped in the exposed regions of the semiconductor layer 4. The N+ ions may be any dopant that can form an active layer in an n-type metal oxide semiconductor (NMOS) thin film transistor (TFT), for example, $PH_3$ ions.

Figure 8:
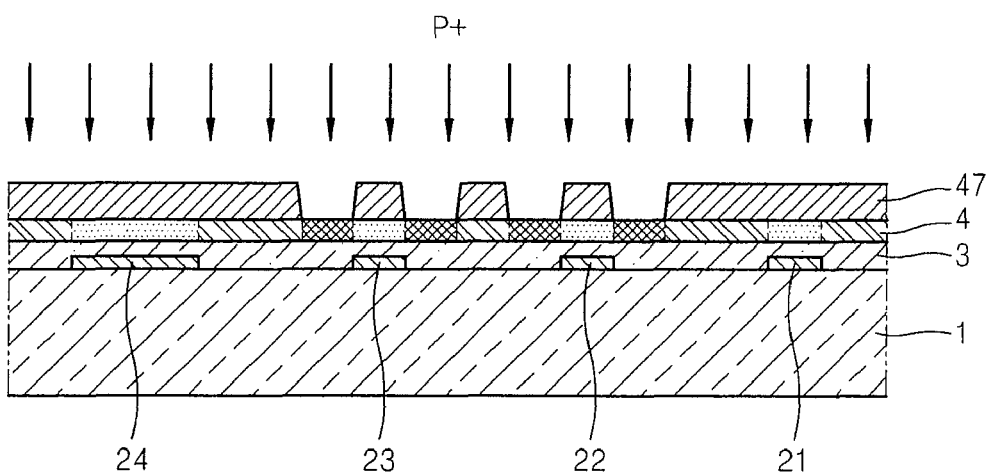
FIG. 8 is a schematic cross-sectional view showing doping of the semiconductor layer after forming a third resist film on the semiconductor layer.

Next, referring to FIG. 8, after removing the second resist film 46, a third resist film 47 is formed on the semiconductor layer 4.

The third resist film 47 may be patterned into a third pattern as shown in FIG. 8 and thus, after coating a photo resist film on the semiconductor layer 4, the photo resist film is exposed through a second photo mask and developed.

The third pattern of the third resist film 47 exposes a region (a second region) of the semiconductor layer 4 corresponding to regions surrounding the second gate electrode 22 and the third gate electrode 23.

In this state, p+ ions are doped in the exposed regions of the semiconductor layer 4. The p+ ions may be any dopant that can form an active layer in a p-type metal oxide semiconductor (NMOS) thin film transistor (TFT), for example, $B_2H_6$.

Figure 9:
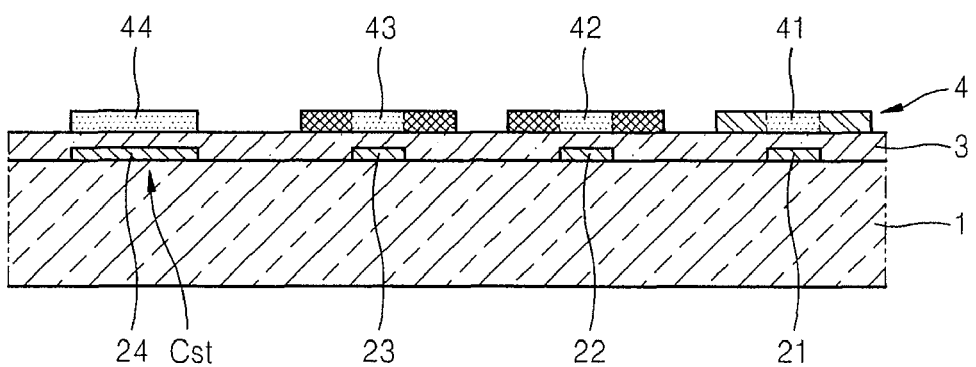
FIG. 9 is a schematic cross-sectional view of a patterned semiconductor layer.

Next, referring to FIG. 9, after removing the third resist film 47, the semiconductor layer 4 is patterned using a photo process. The photo process may be a conventional photolithography process as described above.

That is, after removing the third resist film 47 from the semiconductor layer 4, a fourth resist film is coated on the semiconductor layer 4 and set or predetermined regions of the semiconductor layer 4 are exposed by irradiating light thereon through a third photo mask and developing the fourth resist film. After etching the exposed semiconductor layer 4, remaining portions of the fourth resist film are removed, and thus, a fourth pattern of the semiconductor layer 4 as shown in FIG. 9 is obtained.

The fourth pattern includes a capacitor upper electrode 44, a first active layer 41, a second active layer 42, and a third active layer 43.

The capacitor upper electrode 44 is formed above the capacitor lower electrode 24 and is patterned to correspond to the capacitor lower electrode 24 to form a storage capacitor Cst. The first active layer 41, the second active layer 42, and the third active layer 43 respectively become active layer patterns of thin film transistors.

Figure 10:
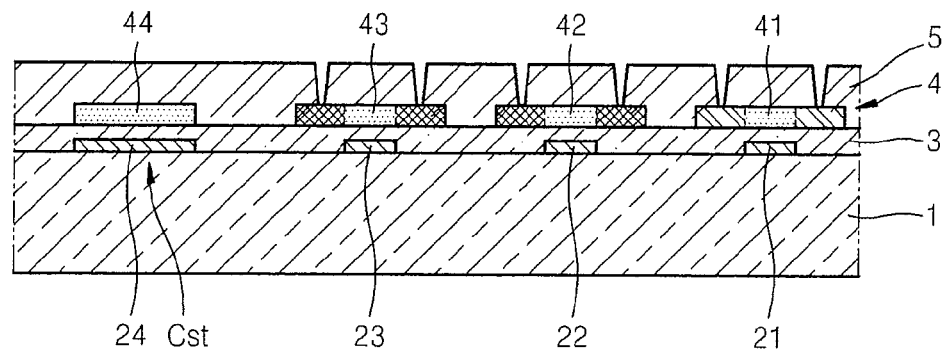
FIG. 10 is a schematic cross-sectional view of a second insulating film covering the semiconductor layer of FIG. 9.

Next, referring to FIG. 10, a second insulating film 5 covering the capacitor upper electrode 44, the first active layer 41, the second active layer 42, and the third active layer 43 is formed on the first insulating film 3.

The second insulating film 5 is patterned to form contact holes so that source/drain regions of the first active layer 41, the second active layer 42, and the third active layer 43 are exposed using a photo process. The photo process may be any suitable photolithography process as described above.

That is, after coating a fifth resist film on the second insulating film 5, regions (e.g., predetermined regions) of the second insulating film 5 are exposed by irradiating light thereon through a fourth photo mask and developing the fifth resist film. After etching the exposed second insulating film 5, remaining portions of the fifth resist film are removed, and thus, the second insulating film 5 having a fifth pattern as shown in FIG. 10 is obtained.

Figure 11:
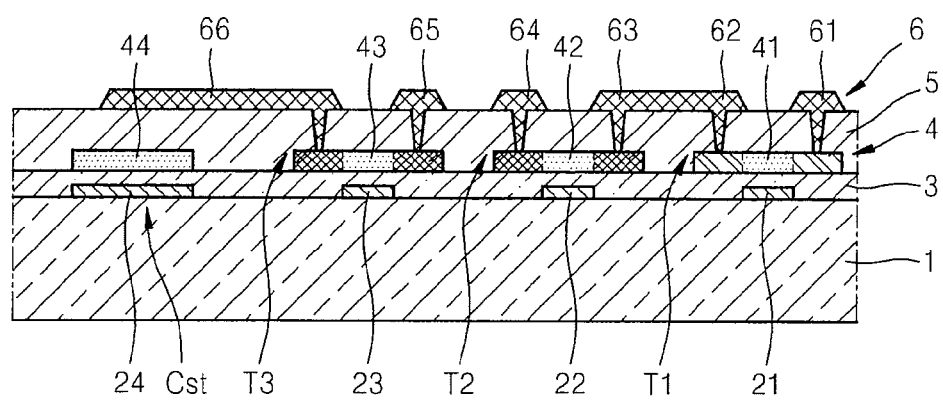
FIG. 11 is a schematic cross-sectional view of a second conductive film pattern formed on the second insulating film of FIG. 10.

Next, after coating a second conductive film 6 on the second insulating film 5, the second conductive film 6 having a sixth pattern as shown in FIG. 11 is formed by patterning the second conductive film 6. The sixth pattern may be formed using any suitable photolithography process as described above.

That is, after coating the second conductive film 6 on the second insulating film 5, a sixth resist film is coated on the second conductive film 6. Regions (e.g., predetermined regions) of the second conductive film 6 are exposed by irradiating light thereon through a fifth photo mask and developing the sixth resist film, and, after etching the second conductive film 6, remaining portions of the sixth resist film are removed, and thus, the second conductive film 6 having a sixth pattern as shown in FIG. 11 is obtained.

The sixth pattern includes a first source electrode 61 and a first drain electrode 62 coupled (e.g., conductively coupled) to the first active layer 41, a second source electrode 63 and a second drain electrode 64 coupled (e.g., conductively coupled) to the second active layer 42, and a third source electrode 65 and a third drain electrode 66 coupled (e.g., conductively coupled) to the third active layer 43. According to another embodiment, the source electrodes 61, 63, and 65 may be drain electrodes, and the drain electrodes 62, 64, and 66 may be source electrodes.

In the above structure, the first gate electrode 21, the first active layer 41, the first source electrode 61, and the first drain electrode 62 constitute a first thin film transistor T1, the second gate electrode 22, the second active layer 42, the second source electrode 63, and the second drain electrode 64 constitute a second thin film transistor T2, and the third gate electrode 23, the third active layer 43, the third source electrode 65, and the third drain electrode 66 constitute a third thin film transistor T3.

In an exemplary embodiment, the first thin film transistor T1 is an NMOS device, and the second and third thin film transistors T2 and T3 are PMOS devices. The first drain electrode 62 of the first thin film transistor T1 and the second source electrode 63 of the second thin film transistor T2 are coupled to each other, thereby forming a CMOS pair of thin film transistors.

The third thin film transistor T3 is a pixel driving thin film transistor and the third drain electrode 66 functions as a pixel electrode. Hereinafter, the reference numeral 66 is used to indicate both the third drain electrode and the pixel electrode.

As described above, the second conductive film 6 that forms the first source electrode 61, the first drain electrode 62, the second source electrode 63, the second drain electrode 64, the third source electrode 65, and the third drain electrode 66 may be formed of a material used to form a pixel electrode.

When the pixel electrode 66 is used as an anode electrode of an organic light emitting display device, the pixel electrode 66 may include a layer formed of a metal oxide having a high work function (absolute value) such as indium tin oxide (ITO), indium zinc oxide (IZO), and/or zinc oxide (ZnO). Also, in some embodiments, if the organic light emitting display device has a structure in which an image is projected in a direction toward an upper side of the organic light emitting display device, that is, in a direction opposite (or facing in opposition) to the substrate 1, the organic light emitting display device further includes a reflection film formed of an alloy of, for example, Al and Ag. Also, in some embodiments, the pixel electrode 66 is used as a cathode electrode of the organic light emitting display device, the pixel electrode 66 is formed of a highly conductive metal having a low work function (absolute value) such as Al, Ag, and/or Mg. In this case, the reflection film described above is unnecessary.

An active matrix substrate according to an exemplary embodiment the present invention is formed using the processes described above. As described above, in manufacturing the active matrix substrate, only five photo masks for patterning are used. Accordingly, the number of processes is reduced, thereby increasing productivity, and thus, reducing manufacturing costs.

Figure 12:
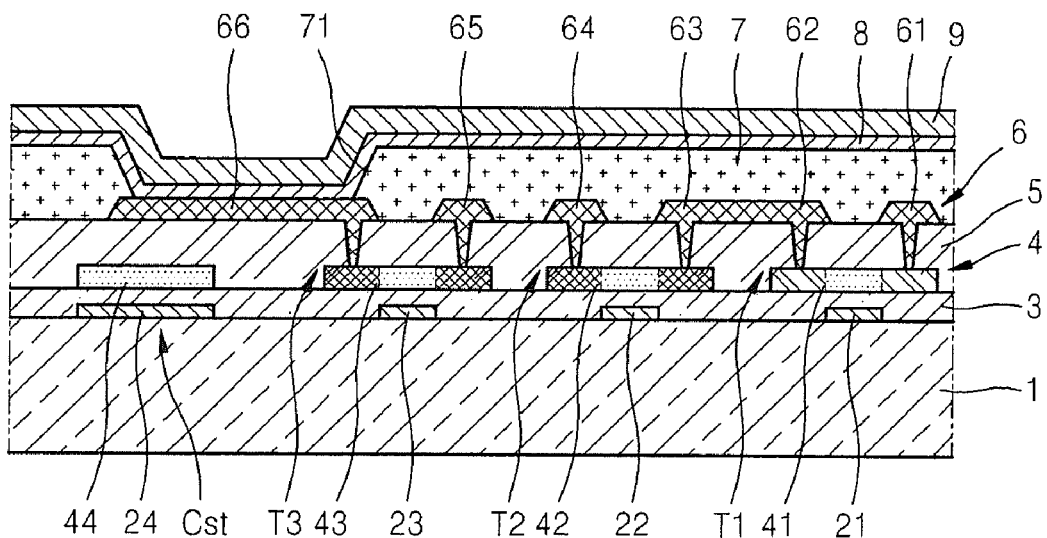
FIG. 12 is a schematic cross-sectional view of a third insulating film, an organic film, and a facing electrode sequentially formed on the second insulating film of FIG. 11.

Referring to FIG. 12, after manufacturing the active matrix substrate having a pattern of the second conductive film 6, according to a further embodiment a third insulating film 7 is formed on the second conductive film 6 having the sixth pattern. The third insulating film 7 is patterned to form an opening 71 that exposes at least a portion of the pixel electrode 66 using a conventional photolithography process.

That is, after coating the third insulating film 7 on the second conductive film 6, a seventh resist film is coated on the third insulating film 7. Next, a region (e.g., a predetermined region corresponding to the opening 71) of the third insulating film 7 is exposed by irradiating light thereon through a sixth photo mask and developing the seventh resist film. After etching the exposed third insulating film 7, remaining regions of the seventh resist film are removed, and thus, the third insulating film 7 having a seventh pattern as shown in FIG. 12 is obtained.

Next, an organic film 8 is deposited on the third insulating film 7. The organic film 8 includes a light emitting layer that can emit different colors in each of the pixels, and the light emitting layer is formed on the pixel electrode 66 exposed through the opening 71.

In some embodiments, the organic film 8 that includes the light emitting layer is formed of a material commonly used to form any suitable organic light emitting display devices.

A facing electrode 9 is formed on the organic film 8 after the organic film 8 is formed. During operation, a voltage having an opposite polarity to a voltage applied to the pixel electrode 66 is applied to the facing electrode 9. That is, the pixel electrode 66 is an anode electrode, the facing electrode 9 is a cathode electrode, and vice versa.

If the organic light emitting display device is a top emission type in which an image emitted from the organic film 8 is projected in a direction toward the facing electrode 9, the facing electrode 9 is formed to have high optical transmittance, and if the organic light emitting display device is a bottom emission type in which an image is projected in a direction toward the substrate 1, the facing electrode 9 is formed to have high optical reflectance.

In manufacturing an organic light emitting display device according to an exemplary embodiment of the present invention, an active matrix substrate which is a base substrate is simply patterned using a reduced number of photo masks, thereby reducing manufacturing costs and increasing productivity.

Also, the semiconductor layer of the thin film transistor is formed of a mono-crystalline semiconductor material, and thus, a circuit having further improved characteristics can be realized.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing an active matrix substrate, the method comprising:
    forming a first electrode having a first pattern on a substrate;
    forming a first insulating film to cover the first electrode on the substrate;
    attaching a first layer on a surface of a semiconductor wafer to the first insulating film;
    transferring the first layer onto the first insulating film to form a semiconductor layer on the first insulating film by electrolysis method;
    patterning the semiconductor layer to form a first active layer having a first region and a second active layer having a second region, wherein the first region and the second region are doped with different types of dopants from each other;
    forming a second insulating film to cover the first and second active layers on the first insulating film; and
    forming a second electrode to couple the first region to the second region on the second insulating film.

2. The method of claim 1, wherein the patterning of the semiconductor layer to form the first and second active layers comprises:
    forming a first resist layer on the semiconductor layer to cover a first portion of the semiconductor layer and to expose the first region of the semiconductor layer through an opening in the first resist layer;
    doping the first region of the semiconductor layer with a dopant through the opening in the first resist layer;
    removing the first resist layer;
    forming a second resist layer on the semiconductor layer to cover a second portion of the semiconductor layer and to expose the second region of the semiconductor layer;
    removing the second resist layer; and
    patterning the semiconductor layer into a second pattern to form the first active layer having the first region and the second active layer having the second region.

3. The method of claim 2, wherein a pattern of the opening in the first resist layer is substantially the same as a pattern in which portions other than portions of the first resist layer corresponding to the first pattern of the first electrode are etched.

4. The method of claim 3, wherein the forming of the first resist layer comprises:
    exposing the first resist layer to light from a lower side of the substrate in accordance with the first pattern of the first electrode; and
    etching the first resist layer so as to maintain portions of the first resist layer substantially to correspond in position to the first pattern of the first electrode.

5. The method of claim 2, wherein the patterning of the semiconductor layer into the second pattern is performed prior to the forming of the first resist layer.

6. The method of claim 1, wherein the attaching of the first layer on the surface of the semiconductor wafer to the first insulating film comprises:
    forming the first layer on the surface of the semiconductor wafer;
    heating the semiconductor wafer with a first temperature and the first insulating film with a second temperature different from the first temperature;
    bringing the first layer on the surface of the semiconductor wafer into contact with the first insulating film;
    applying a voltage between the semiconductor wafer and the first insulating film; and
    peeling a portion of the semiconductor wafer from the first insulating film such that the first layer remains attached to the first insulating film.

7. The method of claim 6, wherein the forming of the first layer on the surface of the semiconductor wafer comprises ion implanting a gas comprising hydrogen ions into the surface of the semiconductor wafer.

8. The method of claim 1, wherein the semiconductor wafer comprises mono-crystalline silicon.

9. A method of manufacturing an organic light emitting display device, the method comprising:
    forming a first gate electrode, a second gate electrode, and a third gate electrode on a substrate;
    forming a first insulating film to cover the first gate electrode on the substrate;
    attaching a first layer on a surface of a semiconductor wafer to the first insulating film;
    transferring the first layer onto the first insulating film to form a semiconductor layer on the first insulating film by electrolysis method;
    patterning the semiconductor layer to form a first active layer having a first region, a second active layer having a second region, and a third active layer having a third region, wherein at least the first region and the second region are doped with different types of dopants from each other;
    forming a second insulating film to cover the first through third active layers on the first insulating film;
    forming a second electrode to couple the first region to the second region and forming a pixel electrode coupled to the third region on the second insulating film;
    forming a third insulating film to cover the second electrode and the pixel electrode on the second insulating film;
    forming an opening in the third insulating film to expose at least one portion of the pixel electrode;
    forming an organic film comprising a light emitting layer on the at least one portion of the pixel electrode exposed through the opening in the third insulating film; and
    forming a facing electrode to cover the organic film.

10. The method of claim 9, wherein the forming of the first through third active layers comprises:
    forming a first resist layer on the semiconductor layer to cover the semiconductor layer and having an opening to expose the first region of the semiconductor layer;
    doping the first region of the semiconductor layer with a dopant through the opening of the first resist layer;
    removing the first resist layer;
    forming a second resist layer on the semiconductor layer to cover the semiconductor layer and having an opening to expose the second and third regions of the semiconductor layer;

doping the second and third regions of the semiconductor layer with a dopant through the opening of the second resist layer; and removing the second resist layer.

11. The method of claim 10, wherein a pattern of the opening in the first resist layer is substantially the same as a pattern in which portions other than portions of the first resist layer corresponding to the first gate electrode, the second gate electrode, and the third gate electrode are etched.

12. The method of claim 11, wherein the forming of the first resist layer comprises:

exposing the first resist layer to light from a lower side of the substrate in accordance with a pattern of the first gate electrode, the second gate electrode, and the third gate electrode; and etching the first resist layer so as to maintain portions of the first resist layer to substantially correspond in position to the pattern of the first through third gate electrodes.

13. The method of claim 10, wherein the patterning of the semiconductor layer is performed prior to the forming of the first resist layer.

14. The method of claim 10, wherein the attaching of the first layer on the surface of the semiconductor wafer to the first insulating film comprises:

forming the first layer on the surface of the semiconductor wafer;

heating the semiconductor wafer with a first temperature and the first insulating film with a second temperature different from the first temperature;

bringing the first layer on the surface of the semiconductor wafer into contact with the first insulating film;

applying a voltage between the semiconductor wafer and the first insulating film; and peeling a portion of the semiconductor wafer from the first insulating film such that the first layer remains attached to the first insulating film.

15. The method of claim 9, wherein forming the first layer on the surface of the semiconductor wafer comprises ion implanting a gas comprising hydrogen ions into a surface of the semiconductor wafer.

16. The method of claim 9, wherein the semiconductor wafer is formed of mono-crystalline silicon.

* * * * *